(12) United States Patent
Shin et al.

(10) Patent No.: US 9,192,072 B2
(45) Date of Patent: Nov. 17, 2015

(54) CURVED MOBILE TERMINAL WITH CURVED BATTERY

(71) Applicant: LG Electronics Inc., Seoul (KR)

(72) Inventors: Choonghwan Shin, Seoul (KR);
Kyungtae Yang, Seoul (KR); Kyuho Lee, Seoul (KR); Jisun Yang, Seoul (KR); Sukho Hong, Seoul (KR);
Seunggeun Lim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 293 days.

(21) Appl. No.: 13/842,509

(22) Filed: Mar. 15, 2013

(65) Prior Publication Data

US 2013/0308282 A1 Nov. 21, 2013

(30) Foreign Application Priority Data

May 15, 2012 (KR) .................. 10-2012-0051613
Sep. 13, 2012 (KR) .................. 10-2012-0101352

(51) Int. Cl.
| H05K 7/14 | (2006.01) |
| H05K 1/02 | (2006.01) |
| H04M 1/02 | (2006.01) |
| H01M 2/02 | (2006.01) |
| H01M 2/10 | (2006.01) |
| H01M 2/30 | (2006.01) |

(52) U.S. Cl.
CPC .............. *H05K 7/14* (2013.01); *H01M 2/021* (2013.01); *H01M 2/0202* (2013.01); *H01M 2/1061* (2013.01); *H01M 2/30* (2013.01); *H04M 1/0262* (2013.01); *H05K 1/0277* (2013.01); *H01M 2002/0205* (2013.01)

(58) Field of Classification Search
CPC .................................. H05K 1/02; H05K 7/14
USPC ........... 361/600, 679.01, 748, 749, 760, 807; 455/575.1, 573; 425/451
See application file for complete search history.

(56) References Cited

U.S. PATENT DOCUMENTS

2011/0058320 A1* 3/2011 Kim et al. ................ 361/679.01
2011/0097615 A1* 4/2011 Goh et al. ....................... 429/94
2011/0115679 A1* 5/2011 Kong et al. .................... 343/702

FOREIGN PATENT DOCUMENTS

| CN | 101971388 A | 2/2011 |
| CN | 102340169 A | 2/2012 |

* cited by examiner

*Primary Examiner* — Jenny L Wagner
*Assistant Examiner* — Ahmad D Barnes
(74) *Attorney, Agent, or Firm* — Birch, Stewart, Kolasch & Birch, LLP

(57) ABSTRACT

A mobile terminal is provided. The mobile terminal includes a front case, a flat panel having a front side facing the front case and a back side, a main printed circuit board supported by the back side of the flat panel, the main circuit printed circuit board having a back side, a battery having a first surface located at a first side thereof and a second surface located at a second side thereof, the battery being located at the back side of the main printed circuit board to form a separation gap between the first curved surface and the back side of the main printed circuit board and at least a portion of an electronic component being mounted on the main printed circuit board and extending into the separation gap. An apparatus for forming a curved battery for the mobile terminal is also provided.

20 Claims, 13 Drawing Sheets

CURVED MOBILE TERMINAL WITH CURVED BATTERY

CROSS-REFERENCE TO RELATED APPLICATIONS

Pursuant to 35 U.S.C. §119(a), this application claims the benefit of earlier filing date and right of priority to Korean Application No. 10-2012-0051613, filed on May 15, 2012 and Korean Application No. 10-2012-0101352, filed on Sep. 13, 2012, the contents of which are hereby incorporated by reference herein in their entirety.

BACKGROUND OF THE DISCLOSURE

1. Field of the Disclosure

The present invention relates to a mobile terminal including a back side that is curved so as to form a slim structure and an apparatus configured to mold a battery loaded in the mobile terminal.

2. Discussion of the Related Art

A mobile terminal is a device which may be configured to perform various functions. Examples of such functions include data and voice communications, capturing images and video via a camera, recording audio, playing music files and outputting music via a speaker system, and displaying images and video on a display. Some terminals include additional functionality which supports game playing, while other terminals are also configured as multimedia players. More recently, mobile terminals have been configured to receive broadcast and multicast signals which permit viewing of contents, such as videos and television programs.

Generally, terminals can be classified into mobile terminals and stationary terminals according to their degree (e.g., ease) of mobility. Further, the mobile terminals can be further classified into handheld terminals and vehicle mount terminals according to the manner of portability.

There are ongoing efforts to support and increase the functionality of mobile terminals. Such efforts include software and hardware improvements, as well as changes and improvements in the structural components which form the mobile terminal.

Meanwhile, to break from the conventional uniform design configured of a flat front and back sides, there are increasing demands on a mobile terminal configured of a curved back side. Generally, to form such a curved back side of the mobile terminal, a rear case of a back cover that has a thick center may be coupled to a LCD panel, a printed circuit board and a battery. As the thickness of the center is increased in the rear case or the back cover, an inner surface of the rear case or the back cover is flat and the opposite outer surface thereof is curved to make curved the back side of the mobile terminal.

However, the thickness of the rear case of the back cover partially increases to make the outer surface curved and the overall thickness of the mobile terminal cannot help increasing. Accordingly, it is difficult to realize the mobile terminal having a slim design and a curved back side simultaneously.

SUMMARY OF THE DISCLOSURE

Accordingly, embodiments of the present invention are directed to a mobile terminal and a method of controlling the mobile terminal that substantially obviate one or more problems due to limitations and disadvantages of the related art.

The present invention is directed to a mobile terminal that substantially obviates one or more problems due to limitations and disadvantages of the related art. An object of the present invention is to provide a mobile terminal that includes a battery having a new appearance to form a curved back side of the mobile terminal so as to realize a slim mobile terminal, compared with a mobile terminal having a flat back side, and an apparatus for molding the battery.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a mobile terminal includes a battery configured to supply a power to a terminal body, comprising a first curved surface formed in a first side thereof and a second curved surface formed a second side thereof; a supporting member placed in the first side of the battery to make one surface thereof support the first curved surface of the battery; and a back cover coupled to the supporting member to cover the second side of the battery to define an exterior of the terminal body, the back cover comprising a central portion that is convexly curved.

In another aspect of the present invention, a mobile terminal includes a front case; a flat panel; a main printed circuit board supported by a back side of the flat panel; and a battery comprising a first surface formed in a first side thereof and a second surface formed in a second side thereof, the battery placed in a back side of the main printed circuit board to form a separation gap between the first curved surface and the main printed circuit board, wherein at least a portion of electronic components mounted on the main printed circuit board are placed in the separation gap.

In a further aspect of the present invention, An apparatus for molding a battery includes an upper mold comprising a core having a lower surface configured of a first curved surface; a lower mold comprising a groove having a lower surface configured of a second curved surface, the lower mold formed in a position corresponding to the core; and a driving unit configured to relatively move the upper mold with respect to the lower mold in a vertical direction to insert the core in the groove, wherein the apparatus molds a battery cell comprising a first side configured of the first curved surface and a second side configured of the second curved surface, when the core and the groove are coupled to each other.

Effects and/or advantages obtainable from the present invention are non-limited the above mentioned effect. And, other unmentioned effects and/or advantages can be clearly understood from the following description by those having ordinary skill in the technical field to which the present invention pertains.

It is to be understood that both the foregoing general description and the following detailed description of the preferred embodiments of the present invention are exemplary and explanatory and are intended to provide further explanation of the invention as claimed.

BRIEF DESCRIPTION OF THE DRAWINGS

The accompanying drawings, which are included to provide further understanding of the invention and are incorporated in and constitute a part of this application, illustrate embodiment(s) of the invention and together with the description serve to explain the principle of the invention. The above and other aspects, features, and advantages of the present invention will become more apparent upon consideration of the following description of various embodiments, taken in conjunction with the accompanying drawing figures. In the drawings.

DESCRIPTION OF SPECIFIC EMBODIMENTS

In the following detailed description, reference is made to the accompanying drawing figures which form a part hereof, and which show by way of illustration specific embodiments of the invention. It is to be understood by those of ordinary skill in this technological field that other embodiments may be utilized, and structural, electrical, as well as procedural changes may be made without departing from the scope of the present invention. Wherever possible, the same reference numbers will be used throughout the drawings to refer to the same or similar parts.

As used herein, the suffixes 'module', 'unit' and 'part' are used for elements in order to facilitate the disclosure only. Therefore, significant meanings or roles are not given to the suffixes themselves and it is understood that the 'module', 'unit' and 'part' can be used together or interchangeably.

Features of embodiments of the present invention are applicable to various types of terminals Examples of such terminals include mobile terminals, such as mobile phones, user equipment, smart phones, mobile computers, digital broadcast terminals, personal digital assistants, portable multimedia players (PMP) and navigators. However, by way of non-limiting example only, further description will be with regard to a mobile terminal 100, and it should be noted that such teachings may apply equally to other types of terminals such as digital TV, desktop computers and so on.

Referring to FIGS. 1A to 3, a structure of a mobile terminal according to one embodiment of the present invention will be described as follows.

Figure 1A:
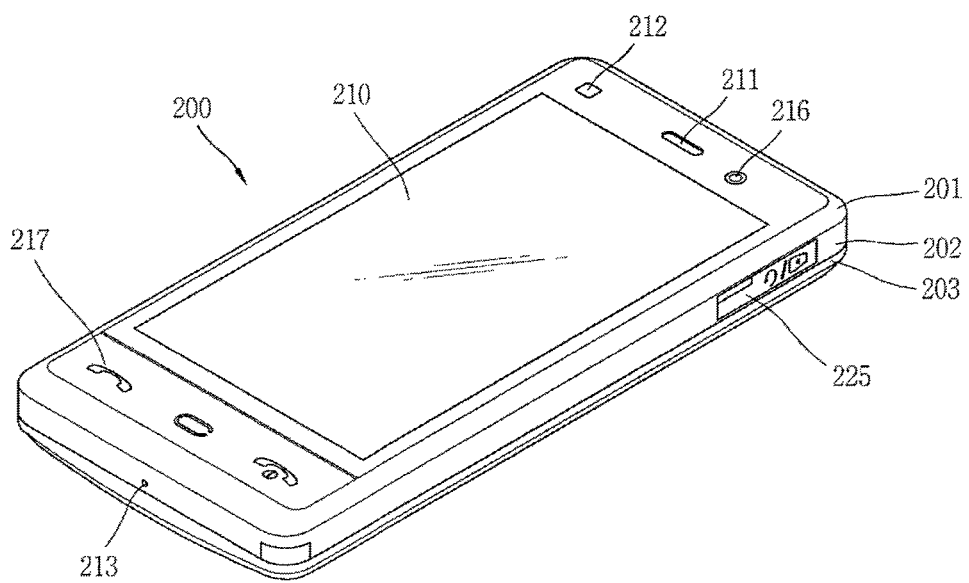
FIG. 1A is a block diagram of a mobile terminal according to one embodiment of the present invention.

FIG. 1A is a front perspective diagram of a mobile terminal according to one embodiment of the present invention.

The mobile terminal 200 shown in the drawing has a bar type terminal body. Yet, the mobile terminal 200 may be implemented in a variety of different configurations. Examples of such configurations include folder-type, slide-type, rotational-type, swing-type and combinations thereof. For clarity, further disclosure will primarily relate to a bar-type mobile terminal 200. However such teachings apply equally to other types of mobile terminals.

Referring to FIG. 1A, the mobile terminal 200 includes a case (casing, housing, cover, etc.) configuring an exterior thereof. In the present embodiment, the case can be divided into a front case 201 and a rear case 202. Various electric/electronic parts are loaded in a space provided between the front and rear cases 201 and 202. Optionally, at least one middle case can be further provided between the front and rear cases 201 and 202 in addition.

Occasionally, electronic components can be mounted on a surface of the rear case 202. The electronic part mounted on the surface of the rear case 202 may include such a detachable part as a battery, a USIM card, a memory card and the like. In doing so, the rear case 202 may further include a backside cover 203 configured to cover the surface of the rear case 202. In particular, the backside cover 203 has a detachable configuration for user's convenience. If the backside cover 203 is detached from the rear case 202, the surface of the rear case 202 is exposed.

Referring to FIG. 1A, if the backside cover 203 is attached to the rear case 202, a lateral side of the rear case 202 may be exposed in part. If a size of the backside cover 203 is decreased, a rear side of the rear case 202 may be exposed in part. If the backside cover 203 covers the whole rear side of the rear case 202, it may include an opening configured to expose a camera 221 or an audio output unit externally.

The cases 201 and 202 are formed by injection molding of synthetic resin or can be formed of metal substance such as stainless steel (STS), titanium (Ti) or the like for example.

A display 210, an audio output unit 211, a camera 216, user input units 217 and 225, a microphone 213, an interface (not shown) and the like can be provided to the terminal body, and more particularly, to the front case 201.

The display 210 occupies most of a main face of the front case 201. The audio output unit 210 and the camera 216 are provided to an area adjacent to one of both end portions of the display 210, while the user input unit 217 and the microphone 213 are provided to another area adjacent to the other end portion of the display 210. The user input unit 225 and the interface can be provided to lateral sides of the front and rear cases 201 and 202.

The input unit is manipulated to receive a command for controlling an operation of the terminal 200. And, the input unit is able to include a plurality of manipulating units 217 and 225. The manipulating units 217 and 225 can be named a manipulating portion and may adopt any mechanism of a tactile manner that enables a user to perform a manipulation action by experiencing a tactile feeling.

Content inputted by the first or second manipulating unit 217 or 225 can be diversely set. For instance, such a command as start, end, scroll and the like is inputted to the first manipulating unit 217. And, a command for a volume adjustment of sound outputted from the audio output unit 211, a command for a switching to a touch recognizing mode of the display 210 or the like can be inputted to the second manipulating unit 225.

Figure 1B:
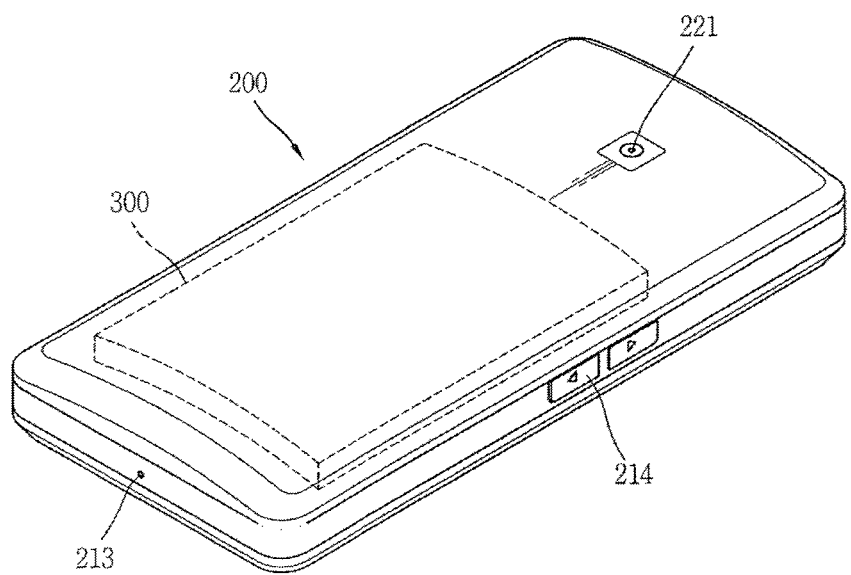
FIG. 1B is a front perspective diagram of a mobile terminal according to the embodiment of 1A.

FIG. 1B is a perspective diagram of a backside of the terminal shown in FIG. 1A.

As shown in FIG. 1B, a back side of a terminal body, in other words, a back side of the rear case 202 may be curved. As the back side of the rear case is curved, the terminal body having a new design can be provided and the user can have enhanced grip, when using the terminal.

Referring to FIG. 1B, a camera 221 can be additionally provided to a backside of the terminal body, and more particularly, to the rear case 202. The camera 221 has a photographing direction that is substantially opposite to that of the former camera 216 shown in FIG. 1A and may have pixels differing from those of the firmer camera 216.

Preferably, for instance, the former camera 216 has low pixels enough to capture and transmit a picture of user's face for a video call, while the latter camera 221 has high pixels for capturing a general subject for photography without transmitting the captured subject. And, each of the cameras 216 and 221 can be installed at the terminal body to be rotated or popped up.

A flash and a mirror are additionally provided adjacent to the camera 221. The flash projects light toward a subject in case of photographing the subject using the camera 221. In case that a user attempts to take a picture of the user (self-photography) using the camera 221, the mirror enables the user to view user's face reflected by the mirror.

An additional audio output unit can be provided to the backside of the terminal body. The additional audio output unit is able to implement a stereo function together with the former audio output unit 211 shown in FIG. 1A and may be used for implementation of a speakerphone mode in talking over the terminal.

A broadcast signal receiving antenna can be additionally provided to the lateral side of the terminal body as well as an antenna for communication or the like. The antenna constructing a portion of the broadcast receiving module can be retractably provided to the terminal body.

The battery 300 is configured to provide a power to the mobile terminal 200. The battery 300 may be loaded in the terminal body or directly detachable from the terminal body. The battery 300 according to the embodiment of the present invention may be loaded in the mobile terminal has curve, with a cross section thereof forming an arc shape. Correspondingly, a cross section of the back cover 203 may form an arc shape.

Specifically, the back side of the terminal body according to the embodiment of the present invention may be curved such as a central portion of the back side may be convex. Also, a lateral side of the terminal body may be formed relatively thin.

In other words, the thickness of the lateral side may be reduced as much as possible to make the mobile terminal look slim and the central portion of the back side may be formed convex to make the user have enhanced grip.

Figure 2:
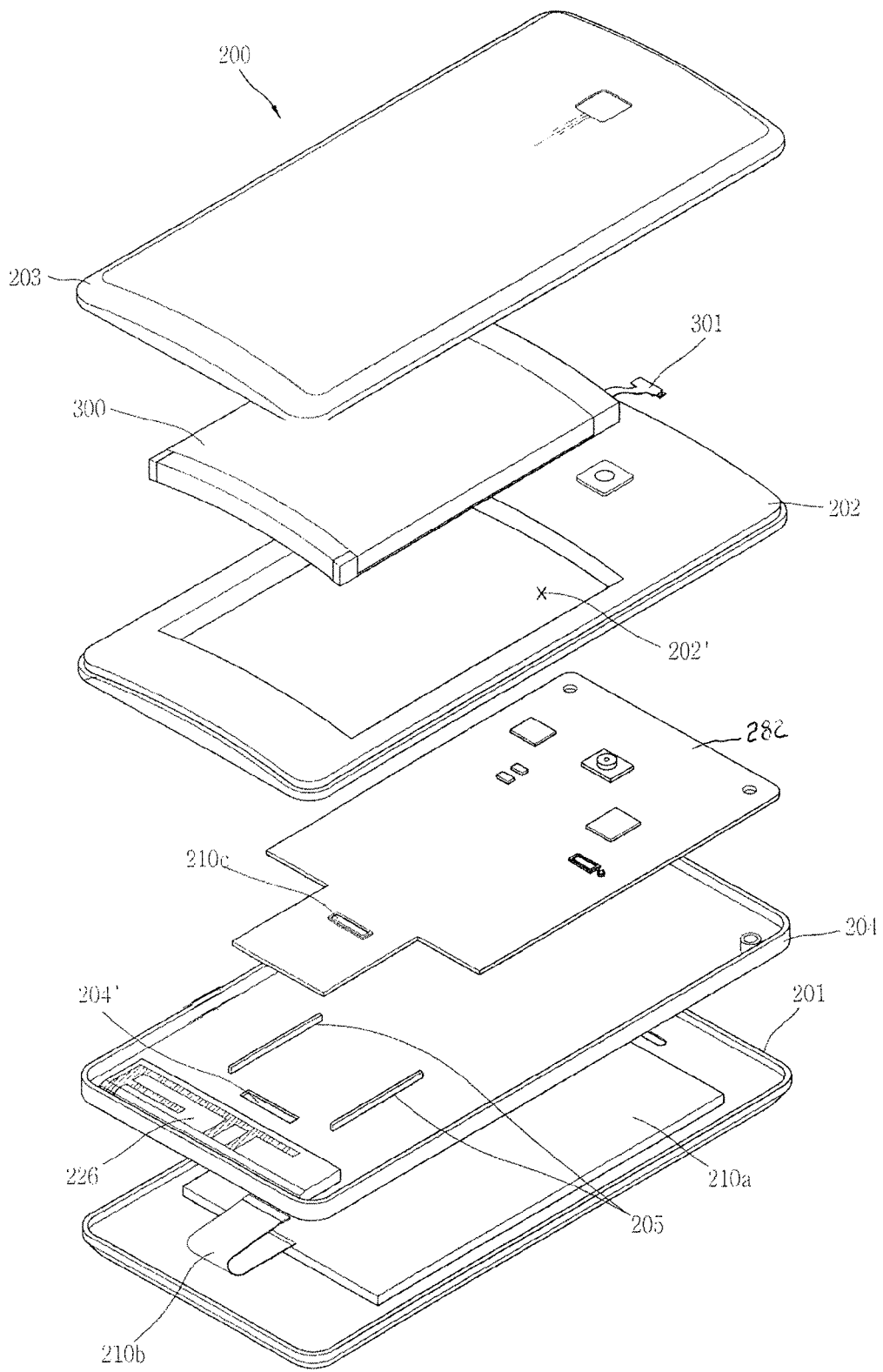
FIG. 2 is a perspective diagram of a mobile terminal according to the embodiment of 1B.
Figure 3:
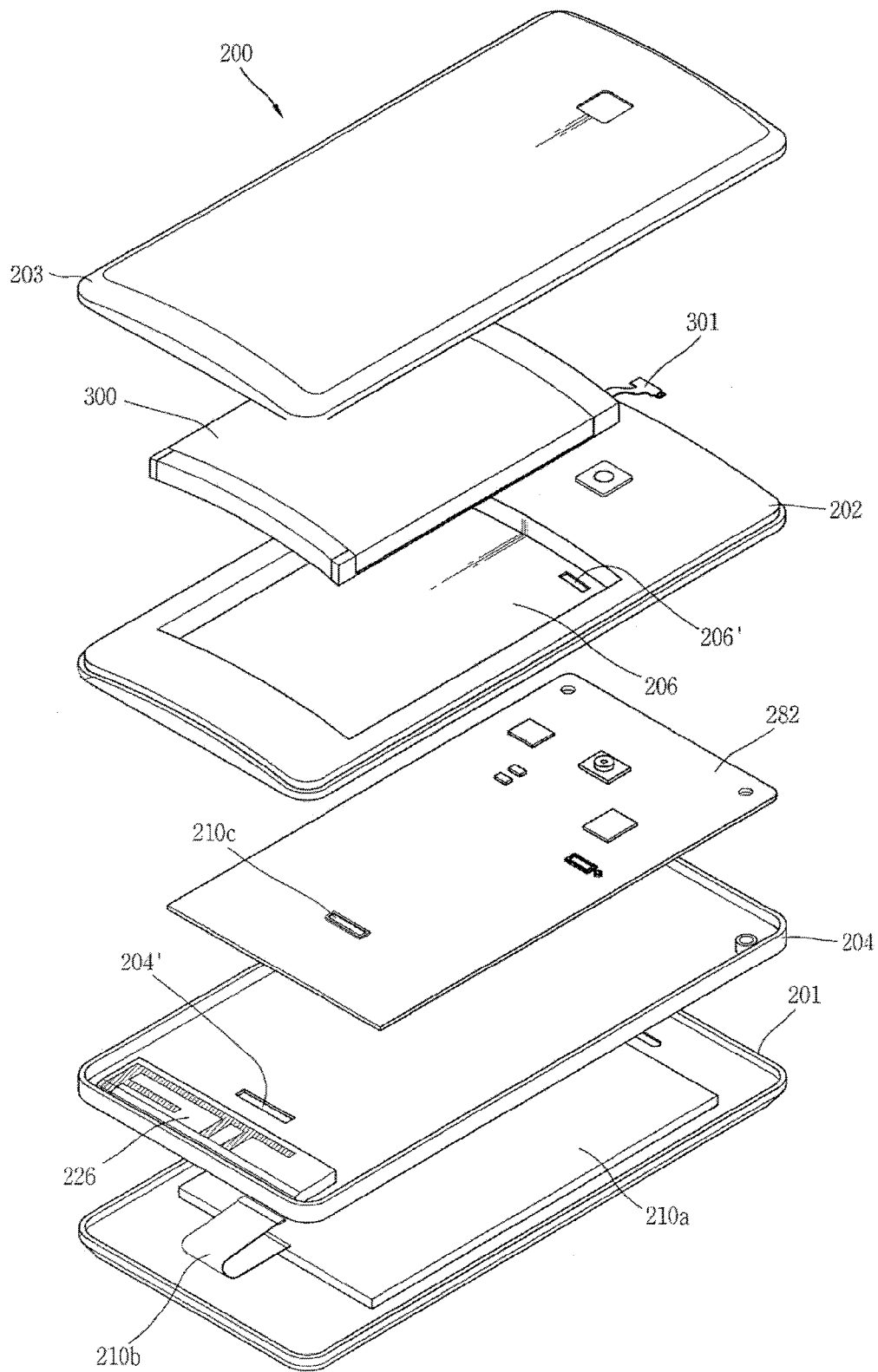
FIG. 3 is an exploded perspective diagram of the mobile terminal shown in FIG. 1B.

Referring to FIGS. 2 and 3, the mounting structure of the curved battery 300 and the inner structure of the mobile terminal 200 according to the first embodiment mentioned above will be described in detail as follows.

FIG. 2 is an exploded perspective diagram of the mobile terminal shown in FIG. 1B.

Referring to FIGS. 1B and 2, the mobile terminal 200 includes the front case, 201, the flat panel 204, the rear case 202 and the back cover 203. It further includes a display unit 210, an antenna unit 226, the main printed circuit board 282 and the battery 300, which are mounted in the case.

The battery 300 is formed in the arc shape, with a first curved surface and a second curved surface that face each other. Each of the first and second curved surfaces is formed at a preset curvature. The curvature may be determined based on a rear design of the exterior appearance possessed by the mobile terminal. In other words, upper and lower surfaces of the curved battery 300 are overlapped with the back cover 203 and the surfaces are curved at the preset curvature. For example, the battery 300 may be convexly curved toward the back side of the mobile terminal.

The curved battery 300 may include a connecting portion to transmit the power to the terminal body. The connecting portion 301 consists of a flexible printed circuit board and a connector. The flexible printed circuit board is connected to the curved battery 300 and the connector is connected to the flexible printed circuit board. Here, the connector is connected to the main printed circuit board to provide the power to the mobile terminal.

The rear case 202 is configured to cover at least a portion of the main printed circuit board 282 and it includes an opening 202' to pass the curved battery 300 there through. The connecting portion 301 is electrically connected to the main printed circuit board 282 via the opening 202'.

In addition, the rear case 202 may be curved at a curvature substantially identical to the curvature of the curved battery 300. Accordingly, a surface of the rear case 202 that faces the back cover 203 and the curved battery 300 may be substantially on the same plane.

The back cover 203 may be coupled to the rear case 202 to cover the curved battery 300. The back cover 203 may defined a back side of the mobile terminal 200 and curved at a curvature that is substantially identical to the curvature of the curved battery 300.

The display unit 210 may include a display panel 210a. The display panel 210a is fixed to the front case 201. The front case 201 and the display panel 210a are formed in a flat plate shape. Accordingly, a front side of the mobile terminal 200 may be substantially flat.

The flat panel 204 may be coupled to the front case 201 and it is configured to support the display panel 210a and it is formed substantially flat. The flat panel 204 is substantially flat and one or more electronic components are mounted in the flat panel 204, except the display panel 210a.

For example, the antenna unit 226 may be mounted in the flat panel 204 and the antenna unit 226 may be formed in a longitudinal end of the mobile terminal 200.

The first curved surface of the curved battery 300 is supported by a supporting member. The supporting member is placed in the first curved surface of the battery 300 to contact the battery, so as to support the battery 300. The supporting member may be a frame, a case or a housing that is part of the body of the mobile terminal 200 and the present invention is not limited thereto.

According to one embodiment, the curved battery 300 may be supported by the flat panel 204. In this case, the supporting member may be the flat panel 204. The cross section of the curved battery 300 is arc-shaped and the flat panel 204 is plate-shaped, such that a separation gap may be formed between the curved battery 300 and the flat panel 204.

The mobile terminal may further include a battery supporting portion disposed between the curved battery 300 and the flat panel 204 to support one surface of the curved battery 300. According to one embodiment, the battery supporting portion includes a supporting protrusion 205 projected from the flat panel 204. The supporting protrusion 205 is configured to contact a curved inner surface of the battery 300 and this embodiment of the present invention is not limited thereto. Alternatively, the supporting protrusion 205 may be formed smaller than the gap formed between the curved battery 300 and the flat panel 205. The supporting protrusion 205 may be formed of a flexible material to support the battery flexibly.

Referring to FIG. 2, the supporting protrusion 205 is extended along a longitudinal direction of the mobile terminal and the appearance of the supporting protrusion 205 is not limited thereto. For example, the supporting protrusion 205 may be column-shaped or cross with the longitudinal direction of the mobile terminal.

The supporting protrusion 205 may prevent the arc-shaped battery from being deformed by an external pressure or shock.

The main printed circuit board 282 is supported by the flat panel 204 and it may be formed in a gap between two supporting protrusions 205. In other words, the main printed circuit board 282 may be placed between the space formed between the flat panel 204 and the curved battery 300.

A contacting portion 210c is formed in the main printed circuit board 282 to contact with the flexible printed circuit board 210b configured to transmit and receive a signal to and from the display panel 210a. The flat panel 204 includes a penetrating hole 204' and the flexible printed circuit board passes through the penetrating hole 204' to connect the main printed circuit board 282 to the display panel 210a.

The contacting portion 210c may be spaced apart from the antenna unit 226. For example, the contacting portion 210c may be formed in a portion of the main printed circuit board 282 and the portion is overlapped with the curved battery 300. The display unit 210a is connected with the flexible printed circuit board 210b and the flexible printed circuit board 210b is electrically connected with the contacting portion 210c formed on the main printed circuit board 282 via the penetrating hole 204'.

Electronic components may be placed in the overlapped portion between the main printed circuit board 282 and the curved battery 300, such that the position of the contacting portion 210c may be freely determined. Accordingly, the contacting portion 210c may be formed to make the spaced distance from the antenna unit 226 and the effect of the contacting portion 210c on the antenna unit 226 may be lessened. In contrast, the inner area of the mobile terminal in which the antenna unit 226 can be formed may be increased.

Accordingly, the ability of the antenna unit 226 mounted in the mobile terminal 200 may be enhanced.

According to one embodiment of the present invention, the main printed circuit board 282 may be expanded to be partially overlapped with the curved battery 300, such that the area where the electronic components are mounted may be expanded and that the volume of the mobile terminal may be reduced.

Only the center of the back side is convexly curved in the mobile terminal such that the central portion may be used in arranging various electronic components, with making the lateral side of the mobile terminal look slim to enhance a visual high-end design, and that the user's grip may be high qualified.

FIG. 3 is an exploded perspective diagram of the mobile terminal shown in FIG. 1B according to the embodiment.

Referring to FIGS. 1A and 3, the mobile terminal 200 includes the front case 201, the flat panel 204, the rear case 202 and the back cover 203. Also, the mobile terminal 200 may further include the display unit 210, the antenna unit 226, the main printed circuit board 282 and the curved battery 300.

The mobile terminal according to this embodiment may include the same or similar components of the mobile terminal shown in FIG. 2, except the appearances of the rear case 202 and the main printed circuit board 282 configured to support the curved battery 300. The same numeral references are given to the same or similar components and detailed description thereof will be omitted accordingly.

According to embodiments of FIGS. 2 and 3, the battery 300 is supported by the rear case 202. In this instance, the supporting member may be the rear case.

A battery receiving portion 206 is formed in the rear case 202 to accommodate the battery 300 and the battery receiving portion 206 is recessed from a surface that faces the back cover 203 of the rear case. The battery receiving portion 206 may be formed in the substantially identical shape to the curved shape of the battery 300. In other words, a supporting surface of the receiving portion 206 configured to support one surface of the arc-shaped battery 300 may be curved at a curvature substantially identical to the curvature of the arc-shaped battery 300.

A connecting hole 206' may be formed in one surface of the battery receiving portion 206 and the connecting portion 301 of the battery may be electrically connected to the main printed circuit board 282 via the connection hole 206'.

The main printed circuit board 282 may include a portion overlapped with the curved battery 300. Accordingly, the area of the main printed circuit board 282 where electronic components can be mounted may be expanded to enlarge the inner space of the mobile terminal.

The structure of the mobile terminal according to the first embodiment of the present invention is described. Next, referring to referring to FIGS. 4A to 10, a structure of a mobile terminal according to a second embodiment of the present invention will be described as follows.

Figure 4A:
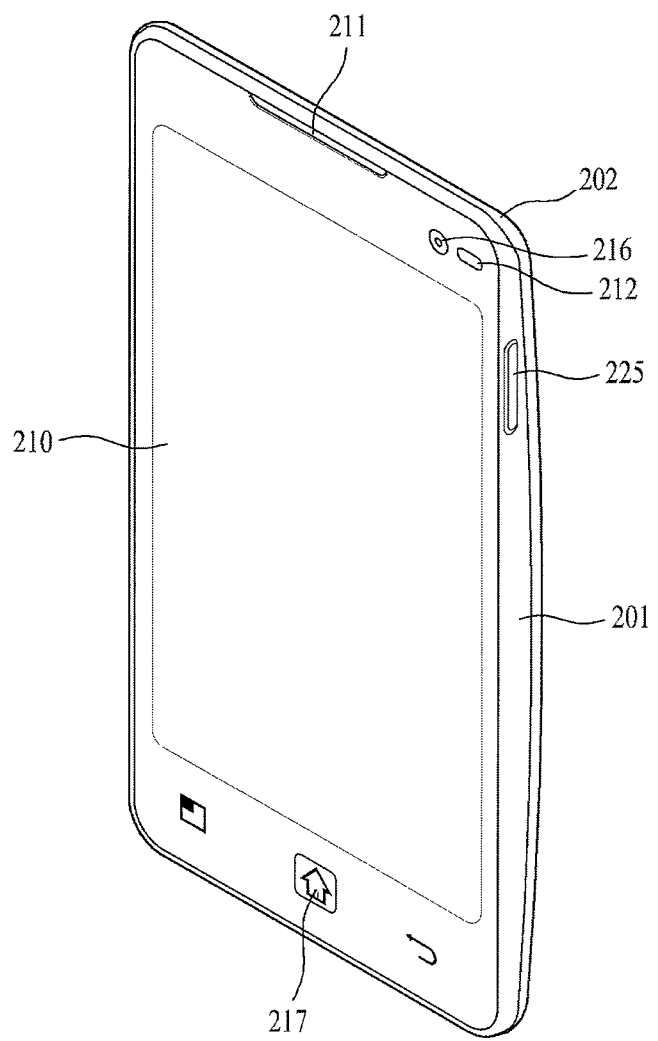
FIG. 4A is a block diagram of a mobile terminal according to another embodiment of the present invention.
Figure 4B:
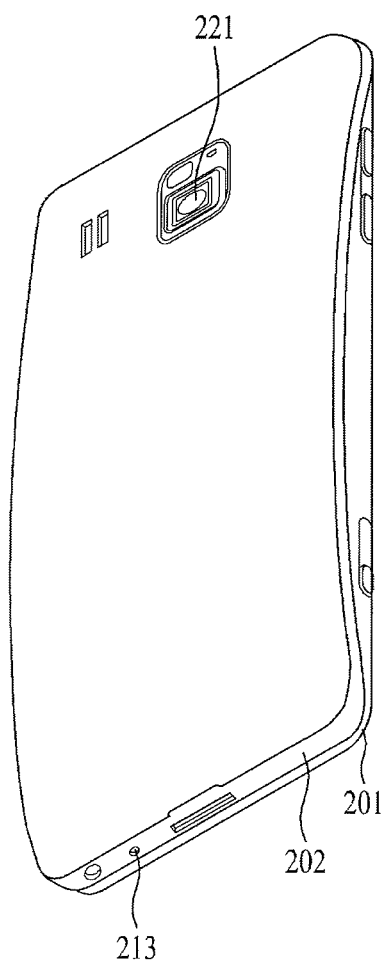
FIG. 4B is a front perspective diagram of a mobile terminal according to the embodiment of 4A.

FIGS. 4A and 4B are front and rear perspective diagrams of the mobile terminal according to this embodiment. Detailed description about an exterior appearance of the mobile terminal is similar to the detailed description of the mobile terminal described referring to FIGS. 1A and 1B and the detailed description will be omitted accordingly.

Figure 5:
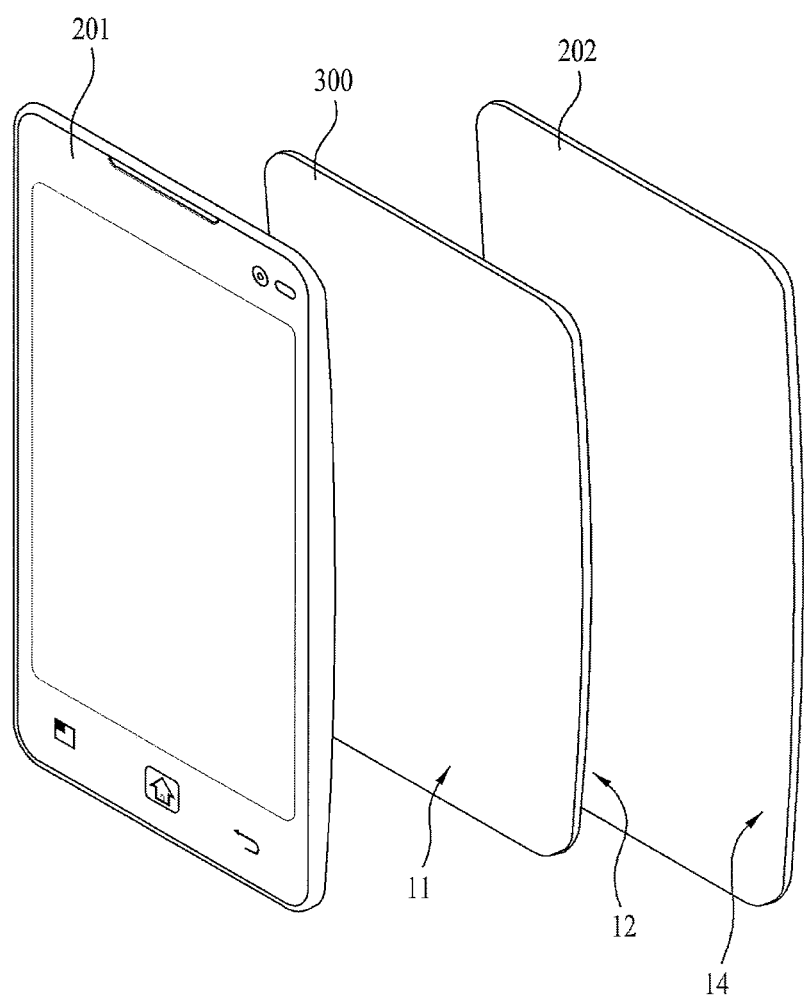
FIG. 5 is a perspective diagram of a mobile terminal according to the embodiment of the 4B.
Figure 6:
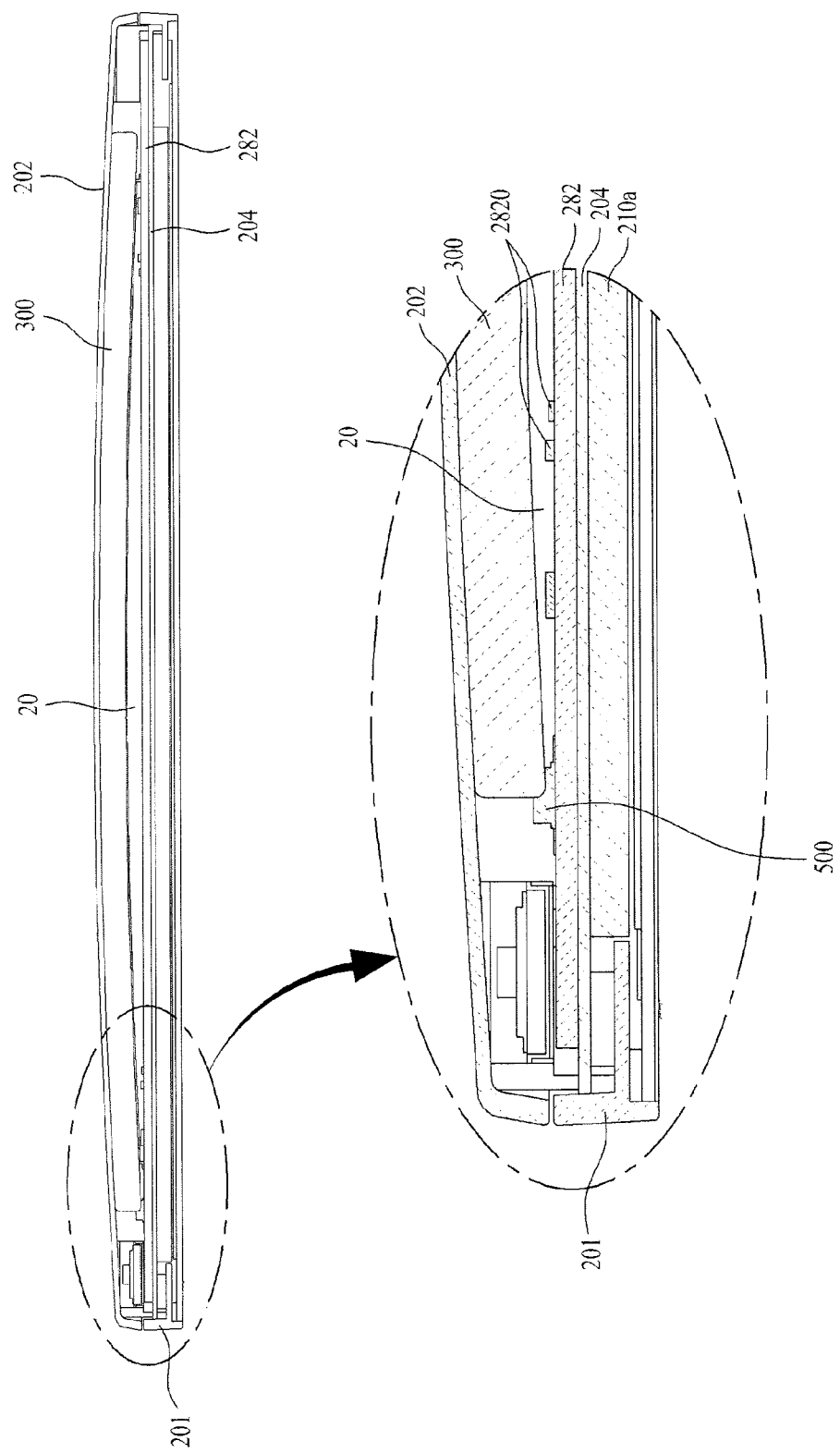
FIG. 6 is a sectional view of a mobile terminal according to the embodiment of 4A.

FIG. 5 is an exploded perspective diagram of the rear case 202, cut-away from the mobile terminal according to one embodiment of the present invention. FIG. 6 is a sectional view of a mobile terminal according to one embodiment of the present invention. As shown in FIGS. 5 and 6, the mobile terminal according to this embodiment may include a front case 201, a flat panel 204, a main printed circuit board 282 and a battery 300.

Referring to FIG. 5, the front case 201, the curved battery 300 and the rear case 202 are shown. As shown in FIG. 6, the main printed circuit board 282 is provided in the front case 201 and it is supported by a back side of the flat panel 204. The flat panel 204 is coupled to a back side of the front case 201 and the main printed circuit board 282 is placed to the back side of the flat panel 204. The main printed circuit board 282 is supported by the back side of the flat panel 204 and it may be flexible PCB (printed circuit board). A display module 210a may be provided in a front side of the flat panel 204 to realize the display unit.

The curved battery 300 may include a first curved surface 11 provided in a first side and a second curved surface 12 provided a second side which is opposite to the first side. Preferably, the first and second curved surfaces 11 and 12 are parallel to each other. As shown in FIG. 6, the curved battery 300 may be loaded in a back side of the main printed circuit board 282 to make the first curved surface toward the main printed circuit board 282. At this time, both ends of the curved battery may be supported by the back side of the main printed circuit board 282 as shown in FIG. 6 or other components, for example, the flat panel 204.

According to this embodiment, the curved battery 300 may be an inner mounted battery 300 that is a rechargeable type as shown in FIGS. 5 and 6. The rear case 202 may be directly coupled to the front case 201 in the curved battery 300 and it may define an exterior appearance of a back side of the mobile terminal. In this instance, the rear case 202 may include a curved surface 14 formed corresponding to the second surface 12 positioned in an outer portion of the mobile terminal, in case the curved battery 300 is loaded in the mobile terminal.

When the first surface 11 of the curved battery 300 is loaded in the back side of the main printed circuit board 282 to make the first surface 11 of the battery placed toward the main printed circuit board 282, a separation gap 20 may be formed between the main printed circuit board 282 and the curved battery 300 by the shape of the first surface 11 as shown in FIG. 6. As shown in the enlarged diagram of FIG. 6, a portion toward the battery 300 of the separation gap 20 may be convex. The separation gap 20 may be used in arrangement of various electronic components in the main printed circuit board 282.

As the convex separation gap generated by the curved shape of the battery is used as the component mounting space, the increased thickness of the mobile terminal generated by the sizes of electronic components 2820 mounted in the main printed circuit board 282 may be prevented when the main printed circuit board 282 and the battery 300 are overlapped. Accordingly, each of the main printed circuit board 282 and the battery 300 has an enlarged flat area, while a slim design of the mobile terminal is realized. The main printed circuit board 282 having such an enlarged flat area is provided and the electronic components can be placed more freely. The battery 300 having the enlarged flat area because of its curved shape may increase the capacity and the duration time.

Referring to FIGS. 7 to 10, various embodiments of the mobile terminal will be described as follows.

According to one embodiment, the mobile terminal may further include a battery supporting portion placed between a curved battery 300 and a main printed circuit board 282. The battery supporting portion includes a third curved surface having a shape corresponding to a first curved surface 11 of the curved battery 300 toward the main printed circuit board 282. The third curved surface 13 may be provided in a separation gap 20 formed by the main circuit board 282 and the first curved surface 11 of the curved battery 300, to contact with the first curved surface 11.

According to this embodiment, the first surface 11 of the curved battery 300 may be supported by the third surface 13 of the battery supporting portion. Accordingly, it is prevented that the curved battery 300 is deformed by an external shock applied to the second curved surface 12 of the battery when the mobile terminal falls and also it is simultaneously prevented that the position of the curved battery 300 is changed. As the battery supporting portion is further provided in the mobile terminal, durability of the mobile terminal can be enhanced.

Figure 7:
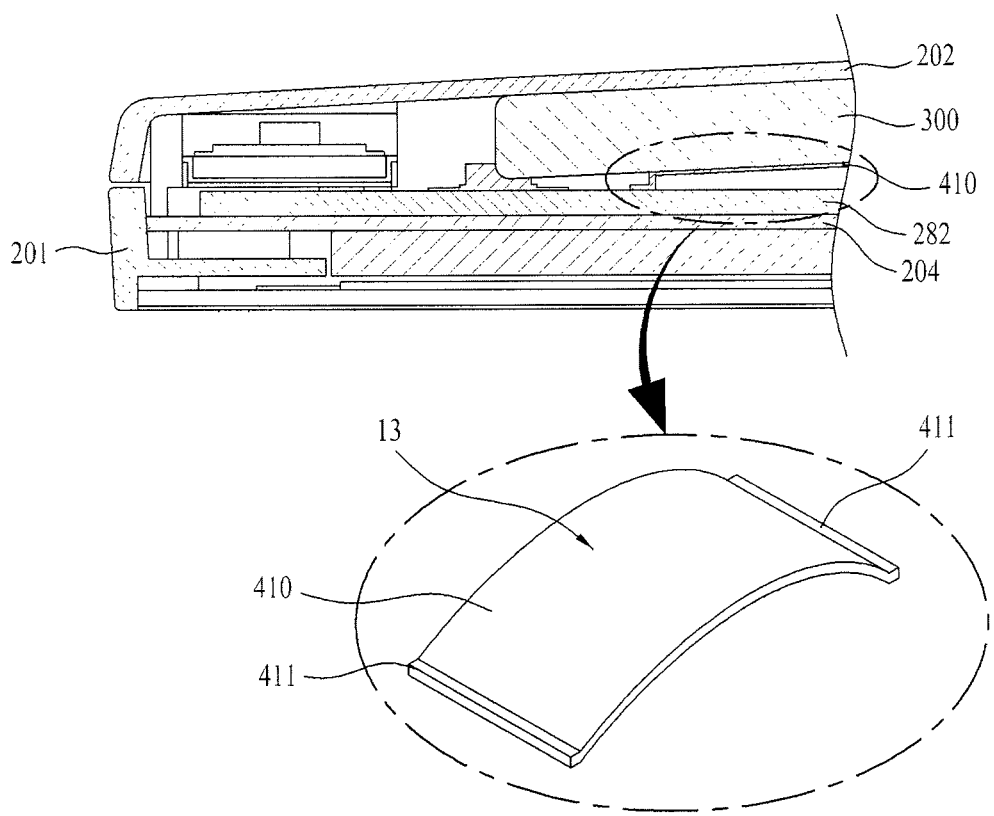
FIGS. 7 and 8 are a sectional diagram of the mobile terminal having a battery supporting portion according to various embodiments and a diagram of the battery supporting portion.
Figure 8:
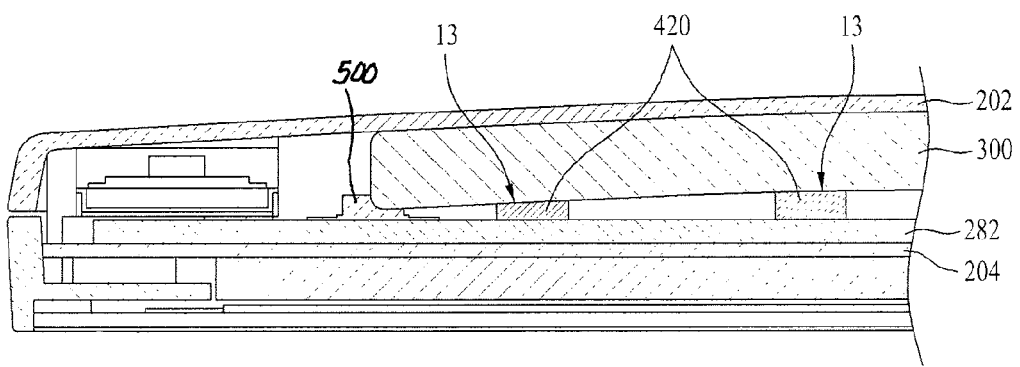

Specifically, FIG. 7 is a sectional view partially illustrating the mobile terminal including the battery supporting portion and a diagram of the battery supporting portion according to the embodiment. FIG. 8 is a sectional diagram partially illustrating a mobile terminal including a battery supporting portion according to another embodiment.

For example, as shown in FIG. 7, the battery supporting portion may be configured of a metallic plate 410. The metallic plate 410 composing the battery supporting portion may be curved to form a third curved surface 13, with bent ends 411. The bent ends 411 may contact with a back side of a main printed circuit board 282 or other components placed in the mobile terminal. Other components may include a flat panel 204.

The metallic plate 410 may be provided in a separation gap 20 formed between the main printed circuit board 282 and the curved battery 300, to closely contact with a first surface of the battery 300. Even when a pressure is applied to the convexly curved surface 13 of the battery by an external shock, the metallic plate 410 may support the curved battery 300 and prevent deformation of the battery.

As a further embodiment, as shown in FIG. 8, a battery supporting portion may be configured of a silicone material 420. A portion of the silicone 420 composing the battery supporting mart may form a third curved surface 13 and the other portion thereof may be supported by other component such as a main printed circuit board 282 or a flat panel 204 to make the third curved surface 13 closely contact with the first curved surface 11. Preferably, two or more silicone battery supporting portions 420 may be provided in a separation gap 20 formed between the main printed circuit board 282 and the curved battery 300, spaced apart from each other. To form the silicone battery supporting portion, silicone may be directly coated in the separation gap 20 between the main printed circuit board 292 and the curved battery 300. Alternatively, a silicone battery supporting portion 420 having the third curved surface 13 may be placed in the separation gap 20, when it is assembled.

Figure 9:
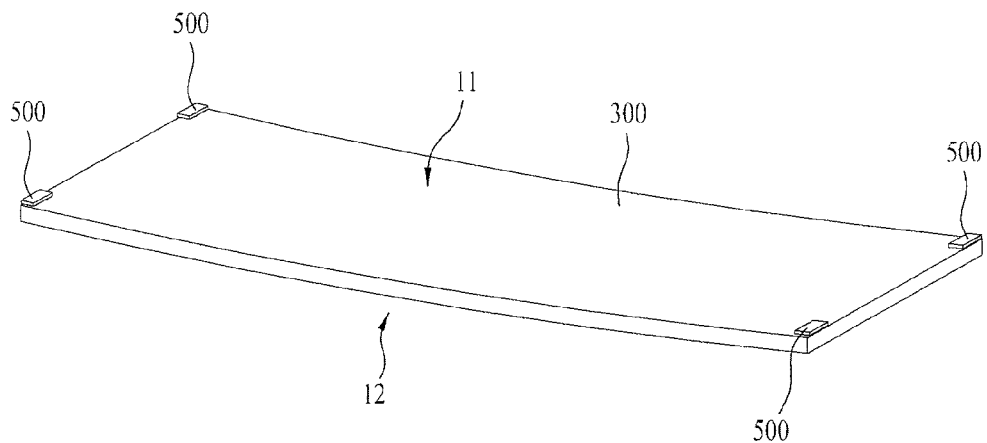
FIG. 9 is a perspective diagram illustrating a battery that includes a damper according to another one of the various embodiments.

According to another embodiment, the mobile terminal may further include a damper 500 formed on a first surface 11 of a curved battery 300. FIGS. 6, 8 and 9 illustrate that the damper 500 according to this embodiment is formed in the curved battery 300.

As shown in FIG. 8, the damper 500 may be formed in each of both end portions where the curved battery 300 contacts with other components of the mobile terminal such as the main printed circuit 282 or the flat panel 204. In other words, the damper 500 may be formed in the portion of the curved battery 300 necessarily contacting with other components to form the separation gap 20 between the battery 300 and the main printed circuit board 282 by using the convexly curved shape of the battery 300. For example, as shown in FIG. 9, the dampers 500 may be formed along the ends of the first curved surface 11 provided in the curved battery 300.

Referring to FIG. 6 again, the damper 500 may be pressed by the battery 300 and the main printed circuit board 282 when the curved battery 300 is loaded in the mobile terminal. Preferably, the damper 500 may be formed of an elastic material and such an elastic material includes silicone and pad.

The damper 500 may be formed in the curved battery 300 according to various methods. As one of examples, the damper 500 may be double-injection-molded together with the curved battery 300. In this instance, the damper 500 may be integrally formed with the curved battery 300. As another example, the damper 500 may be independently formed from the curved battery 300 and it may be attached to the battery 300.

According to this embodiment, the damper 500 is provided in the portion of the curved battery 300 that is supported by other components when the battery is loaded. In case an external shock is applied to the curved battery 300 by the user's missing the mobile terminal, damage to the battery 300 or the other components can be prevented. The curved battery 300 may be supported by the other component via a relatively small area. In case the external shock is applied to such the battery 300, a stronger force could be applied to the contacting area between the battery and the other component than the force applied to the flat battery. The damper 500 is configured to absorb the force and the durability of the mobile terminal may be enhanced.

According to a further embodiment, the curved battery 300 may be a replaceable type loaded in the mobile terminal. In this instance, a disadvantage of large power consumption generated by diverse functions of the mobile terminal 200 can be made up for.

Figure 10:
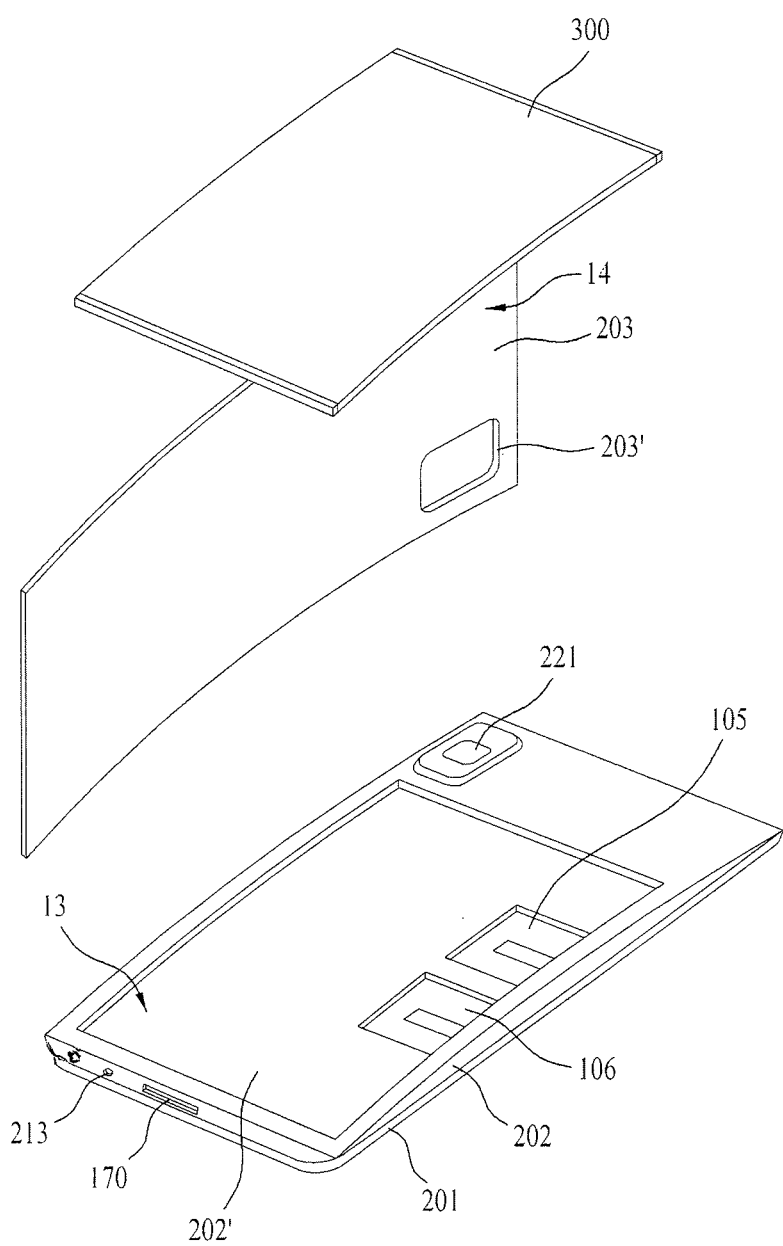
FIG. 10 is an exploded perspective diagram illustrating a back cover and a battery to a further embodiment provided in the mobile terminal according, cut-away.

FIG. 10 is a rear perspective view illustrating a surface of the rear case 202, cutting away the back cover 203 of the mobile terminal including the replaceable curved battery 300.

Referring to FIG. 10, there are shown a front case 201, a rear case 202, a back cover (or battery cover) 203, a camera unit 221, an interface 170, a microphone 213, an audio output unit 152', a battery 300, a battery receiving portion 202', a USIM card loading part 105 and a memory card loading part 106.

According to this embodiment, the rear case 202 may be coupled to the front case 201 between the main printed circuit board 282 and the curved battery 300. At this time, the rear case 202 may include a third surface 13 formed in at least a portion thereof, corresponding to a first surface 11 of the curved battery 300. It is preferred that the third surface 13 is recessed from a surface of the rear case 202, to form the battery receiving portion 202'. A connection terminal is provided in the battery receiving portion 202' to be electrically connected with the component mounted in the case.

When the curved battery 300 is loaded in the battery receiving portion 202', the third curved surface 13 of the rear case 202 may contact with the first surface 11 of the curved battery. Accordingly, the third curved surface 13 of the rear case 202 supports the first curved surface 11 of the battery 300, such that the rear case may prevent the curved battery 300 from be deformed by an external shock. In addition, a separation gap 20 may be formed between the third surface 13 of the rear case 202 and the main printed circuit board 282. The electronic components 2820 mounted on the main printed circuit board 282 may be positioned in the separation space 20.

On the surface of the rear case 202 may be provided the USIM card loading part 105 and the memory loading part 106 to load external components therein, except the battery accommodating part 202'. Typically, the external components mounted in the surface of the rear case 202 are configured to expand functions of the mobile terminal to meet the diverse functions of the mobile terminal and consumers' requests.

As shown in FIG. 10, the USIM card loading part 105 and the memory card loading part 106 may be formed adjacent to the battery receiving portion 202' or in a lower surface of the battery receiving portion 202'. When the battery 300 is separated from the battery receiving portion 202', the USIM card loading part 105 and the memory card loading part 106 may be exposed outside. In this instance, the size of the battery receiving portion 202' may be enlarged to enable the large-sized battery 300.

FIG. 10 illustrates that the USIM card loading part 105 and the memory card loading part 106 are mounted in a back side of the rear case 202. Optionally, they may be inserted in or separated from a lateral side of the mobile terminal 200.

The back cover 203 configured to cover a surface of the rear case 202 may include a fourth surface 14 formed corresponding to the second surface 12 that is an outer portion of the curved battery 300. The back cover 203 may be coupled to the rear case 202.

The back cover 203 may fix the battery 300 and the USIM card and the memory card loaded in the surface of the rear case 202 not to separate there from and it may protect those external components from foreign substances. Recently, the back cover may be further provided with a waterproof function to close the back cover airtight when the back cover 203 is coupled to the rear case 202, so as to prevent water from coming into the external components.

Figure 11:
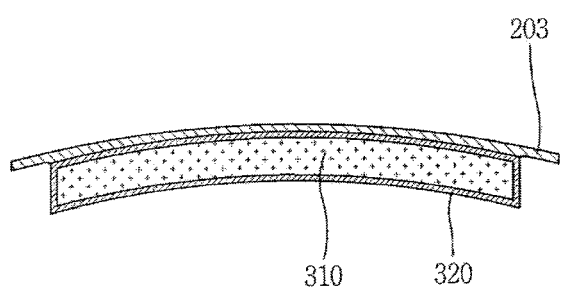
FIG. 11 is a sectional view of a battery and a back cover that are foamed in a curved shape according to the embodiment of FIG. 4A.

Referring to FIG. 11, the detailed structure of the curved battery according to the present invention will be described as follows. FIG. 11 is a sectional view of the curved battery 300 and the back cover 203.

As shown in FIG. 11, the battery 300 includes a polymer cell 310 and a case 320. The polymer cell 310 is formed of lithium ion battery cell or lithium polymer cell.

Lithium or lithium-graphite compound may be used as a positive pole of the lithium ion battery cell. $LiCoO_2$, $LiFePO_4$ or $LiMnO_4$ may be used as a negative pole thereof. Lithium as electrolyte may be dissolved in an organic solution including tetrahydrofuran and such lithium may include $LIPF_4$, $LIBF_4$ and $LIClO_4$.

Lithium or lithium-graphite compound may be used as a positive pole of the lithium polymer cell and $LiCoO_2$, $LiFePO_4$ or $LiMnO_4$ may be used as a negative pole thereof, like the lithium ion battery cell. However, a conducting polymer electrolyte may be used as a membrane, which is a difference. The polymer electrolyte is formed of an electro conductive salt including LiPF6 or silicone dioxide mixed to a solid polymer including polyethylene oxide.

The polymer cell 310 is covered by a case 320 and the case 320 may be formed of polycarbonate. The case 320 is realized and the polymer cell 310 is inserted in the case 320, to fabricate the polymer cell 310. The case 320 may be formed by ultrasonic joining. Meanwhile, the case 320 may be formed of a can and the polymer cell 310 is inserted in the case 320 formed of the can.

Accordingly, the polymer cell 310 having flexibility may be fitted to the exterior appearance of the terminal body and it may prevent damage to the mobile terminal.

Meanwhile, the back cover 203 may be fixed to the case 320 formed of polycarbonate or the can. One surface of the case 320 and the cover 203 may be integrally formed with each other. In this instance, the battery 300 may be a fixed type irreplaceable from the terminal body and prevent damage and structural deformation of the battery 300.

Figure 12:
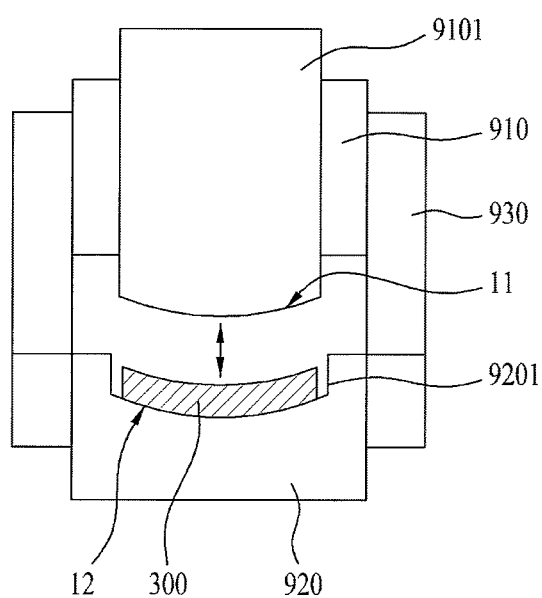
FIG. 12 is a diagram illustrating a press-molding apparatus according to one embodiment of the present invention.

Referring to FIG. 12, a structure and operation of an apparatus for molding the battery (hereinafter, a press molding apparatus) according to one embodiment of the present invention will be described as follows. As shown in FIG. 12, the press molding apparatus according to this embodiment includes an upper mold 910, a lower mold 920 and a driving unit 930.

As shown in FIG. 12, the upper mold 910 includes a core 9101 having a lower surface configured as a first surface 11. A groove 9201 having a lower surface configured as a second surface 12 may be formed in a portion of the lower mold 920 corresponding to the core 9101. The driving unit 930 may relatively move the upper mold 910 with respect to the lower mold 920, to insert the core 9101 of the upper mold 910 in the groove 9201 of the lower mold 920. The core 9201 of the upper mold 910 is inserted in the groove 9201 of the lower mold 920 in a state where the material of the battery cell is injected in the groove 9201 of the lower mold 920. After that, a portion of the battery cell includes the first curved surface 11 and the other portion thereof includes the second curved surface 12.

When the press molding apparatus according to this embodiment is used, the curved battery 300 may be conveniently fabricated through a high temperature press process. The curved battery 300 includes the curved back side, while it is used in fabricating a slim mobile terminal.

It will be apparent to those skilled in the art that the present invention can be specified into other forms without departing from the spirit or scope of the inventions.

In addition, the above-described methods can be implemented in a program recorded medium as computer-readable codes. The computer-readable media include all kinds of recording devices in which data readable by a computer system are stored. The computer-readable media include ROM, RAM, CD-ROM, magnetic tapes, floppy discs, optical data storage devices, and the like for example and also include carrier-wave type implementations (e.g., transmission via Internet). And, the computer can include the control unit 180 of the terminal.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A mobile terminal comprising:
    a terminal body;
    a battery configured to supply power to the terminal body, the battery including a first curved surface formed at a first side thereof and a second curved surface formed at a second side thereof;
    a supporting member located at the first side of the battery, the supporting member having a first surface configured to support the first curved surface of the battery;
    a back cover coupled to the supporting member to cover the second side of the battery to define an exterior of the terminal body, the back cover including a central portion that is convexly curved;
    a separation gap formed between the first curved surface of the battery and the supporting member; and
    a battery supporting portion provided in the separation gap, the battery supporting portion having a third curved surface that corresponds to a shape of the first curved surface, the third curved surface being configured to contact the first curved surface.

2. The mobile terminal according to claim 1, wherein the supporting member is a flat panel.

3. The mobile terminal according to claim 2, wherein the battery supporting portion includes a supporting protrusion projected from the first surface of the supporting member.

4. The mobile terminal according to claim 3, wherein the supporting protrusion is formed of a flexible material to flexibly support the battery.

5. The mobile terminal according to claim 2, further comprising a main printed circuit board located at the first surface of the supporting member such that the main printed circuit board is located in the separation gap.

6. The mobile terminal according to claim 5, further comprising:
    a display unit located at a second surface of the supporting member to output visual information, the display unit including a flexible printed circuit board connected to the main printed circuit board to transmit and receive a signal to and from the main printed circuit board; and
    a connector configured to connect the flexible printed circuit board to the main printed circuit board.

7. The mobile terminal according to claim 6, further comprising a contacting portion electrically connected to the connector, the contacting portion being formed on the main printed circuit board.

8. The mobile terminal according to claim 7, further comprising an antenna unit formed in an end of the terminal body to transmit and receive a wireless communication signal,
    wherein the contacting portion is spaced apart from the antenna unit to shield the antenna unit from an electrical influence.

9. The mobile terminal according to claim 1, further comprising a main printed circuit board located in the terminal body and electrically connected to the battery,
    wherein the battery includes a connecting portion projecting from the battery to electrically connect the battery to the main printed circuit board, and
    wherein the supporting member is a rear case configured to cover at least a portion of the main printed circuit board, the supporting member including a battery receiving portion recessed from the first surface to receive the battery and a connection hole configured to allow the connecting portion to pass through the supporting member, the battery receiving portion having a shape corresponding to the shape of the battery.

10. The mobile terminal according to claim 9, wherein a surface of the battery receiving portion that supports the battery is curved to have a shape corresponding to the first curved surface of the battery.

11. A mobile terminal comprising:
    a front case;
    a flat panel having a front side facing the front case and a back side;
    a main printed circuit board supported by the back side of the flat panel, the main circuit printed circuit board having a back side;
    a battery having a first curved surface located at a first side thereof and a second curved surface located at a second side thereof, the battery being located at the back side of the main printed circuit board to form a separation gap between the first curved surface and the back side of the main printed circuit board;
    at least a portion of an electronic component being mounted on the main printed circuit board and extending into the separation gap; and
    a back cover having a fourth curved surface that corresponds to a shape of the second curved surface of the battery,
    wherein a curved section of the separation gap overlaps, in a planar direction, with the at least the portion of the electronic component.

12. The mobile terminal according to claim 11, further comprising a battery supporting portion provided in the separation gap, the battery supporting portion having a third curved surface that corresponds to a shape of the first curved surface, the third curved surface being configured to contact the first curved surface.

13. The mobile terminal according to claim 12, wherein the battery supporting portion is formed of a metallic plate, the battery supporting portion having bent ends to contact the back side of the main printed circuit board.

14. The mobile terminal according to claim 12, wherein the battery supporting portion is formed of silicone, the battery supporting portion being located on the back side of the main printed circuit board, and a portion of the silicone is formed to provide the third curved surface.

15. The mobile terminal according to claim 11, further comprising a rear case having a third curved surface that corresponds to a shape of the second curved surface of the battery, the rear case being coupled to the front case such that the battery is located between the front case and the rear case.

16. The mobile terminal according to claim 11, further comprising a plurality of dampers, each of the dampers being formed on opposite ends of the first curved surface of the battery, the plurality of dampers being located between the battery and the main printed circuit board so as to be pressed when the battery is inserted into the mobile terminal.

17. The mobile terminal according to claim 16, wherein the damper is double-injection-molded with the battery to be integrally formed with the battery.

18. The mobile terminal according to claim 11, further comprising a rear case having a third curved surface that corresponds to a shape of the first curved surface of the battery, the third curved surface contacting the first curved surface of the battery, the rear case being arranged such that the rear case is located between the battery and the front case.

19. The mobile terminal according to claim 18, wherein the back cover is coupled to the rear case such that the battery is located between the back cover and the rear case.

20. A mobile terminal comprising:

a terminal body;

a battery configured to supply a power to a terminal body, the battery including a first curved surface formed at a first side thereof and a second curved surface formed at a second side thereof;

a supporting member located at the first side of the battery, the supporting member having a first surface configured to support the first curved surface of the battery;

a back cover coupled to the supporting member to cover the second side of the battery to define an exterior of the terminal body, the back cover comprising a central portion that is convexly curved; and a main printed circuit board located in the terminal body and electrically connected to the battery, wherein the battery includes a connecting portion projecting from the battery to electrically connect the battery to the main printed circuit board, and wherein the supporting member is a rear case configured to cover at least a portion of the main printed circuit board, the supporting member including a battery receiving portion recessed from the first surface to receive the battery and a connection hole configured to allow the connecting portion to pass through the supporting member, the battery receiving portion having a shape corresponding to the shape of the battery.

* * * * *